US007279374B2

(12) United States Patent
So

(10) Patent No.: US 7,279,374 B2
(45) Date of Patent: *Oct. 9, 2007

(54) THIN FILM TRANSISTOR AND METHOD OF MANUFACTURING THE SAME

(75) Inventor: Woo-Young So, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 645 days.

This patent is subject to a terminal disclaimer.

(21) Appl. No.: 10/801,146

(22) Filed: Mar. 16, 2004

(65) Prior Publication Data

US 2004/0175871 A1 Sep. 9, 2004

Related U.S. Application Data

(63) Continuation of application No. 10/114,463, filed on Apr. 3, 2002, now Pat. No. 6,706,573.

(30) Foreign Application Priority Data

Apr. 4, 2001 (KR) .............................. 2001-018010

(51) Int. Cl.
   *H01L 21/84* (2006.01)
(52) U.S. Cl. ...................... 438/166; 483/486; 257/347; 257/353
(58) Field of Classification Search ...................... None
   See application file for complete search history.

(56) References Cited

U.S. PATENT DOCUMENTS 4,997,780 A   3/1991   Szluk et al. ................ 438/153

5,904,509 A   5/1999   Zhang et al. ................ 438/154
6,097,037 A * 8/2000   Joo et al. ...................... 257/55

(Continued)

FOREIGN PATENT DOCUMENTS

CN   1155166 A   7/1997

OTHER PUBLICATIONS

Kim, Tae-Kyung, G.B. Kim; B.I. Lee, S.K. Joo. "The effects of electrical stress and temperature on the properties of polycrystalline silicon thin-film transistors fabricated by metal induced lateral crystallization." IEEE Electron Device Letters vol. 21, No. 7 (Jul. 2000): p. 347-349.*

*Primary Examiner*—Evan Pert
*Assistant Examiner*—Eric Bomkamp
(74) *Attorney, Agent, or Firm*—H.C. Park & Associates, PLC

(57) ABSTRACT

A method of manufacturing a thin film transistor is disclosed. The method includes forming an amorphous silicon layer and a blocking layer on an insulating substrate, forming a photoresist layer having first and second photoresist patterns on the blocking layer, etching the blocking layer using the first photoresist pattern as a mask to form first and second blocking patterns, reflowing the photoresist layer, forming a metal layer over the entire surface of the insulating substrate, removing the photoresist layer to expose the blocking layer and an offset region between the blocking layer and the metal layer, crystallizing the amorphous silicon layer to form a poly silicon layer having a MILC front, etching the polysilicon layer using the first and second blocking patterns as a mask to form first and second semiconductor layers and to remove the MILC front, and removing the first and second blocking patterns.

2 Claims, 14 Drawing Sheets

U.S. PATENT DOCUMENTS

| | | | |
|---|---|---|---|
| 6,218,220 B1 | 4/2001 | So | 438/151 |
| 6,396,147 B1 | 5/2002 | Adachi et al. | 257/758 |
| 6,514,803 B1 | 2/2003 | Arai et al. | 438/164 |
| 6,521,491 B2 | 2/2003 | Lee et al. | 438/156 |
| 2001/0005596 A1* | 6/2001 | Lee et al. | 438/29 |
| 2002/0058365 A1 | 5/2002 | Lee et al. | 438/166 |
| 2002/0068390 A1 | 6/2002 | Gosain et al. | 438/149 |
| 2003/0032210 A1 | 2/2003 | Takayama et al. | 438/30 |

\* cited by examiner

THIN FILM TRANSISTOR AND METHOD OF MANUFACTURING THE SAME This application is a continuation of U.S. application Ser. No. 10/114,463 filed Apr. 3, 2002 now U.S. Pat. No. 6,706,573.

BACKGROUND OF THE INVENTION

1. Field of the Invention

The present invention relates to a thin film transistor and a method of manufacturing the same, and, more particularly, to a thin film transistor manufactured according to a method that provides high electrified mobility, high reliability and simplified manufacturing.

2. Description of Related Art

A poly silicon layer is generally used as a semiconductor layer of a thin film transistor (TFT). The poly silicon layer is formed such that an amorphous silicon layer is first deposited on a substrate and crystallized at a predetermined temperature. A method of crystallizing the amorphous silicon layer includes an eximer laser annealing (ELA) technique, a solid phase crystallization (SPC) technique, and a metal induced lateral crystallization (MILC) technique.

Of these techniques, the MILC technique is disclosed in U.S. Pat No. 6,097,037 and has an advantage in that the amorphous silicon layer is crystallized at a relatively low temperature and at a relatively short processing time in comparison with the ELA technique and the SPC technique.

FIGS. 1A to 1B are cross-sectional views illustrating a process of manufacturing the TFT using the MILC technique according to conventional methods.

Referring to FIG. 1A, an amorphous silicon layer 11 is formed such that an amorphous silicon is deposited on an insulating substrate 10 using a low pressure chemical vapor deposition (LPCVD) technique and patterned in the form of an island.

A gate insulating layer 12 and a gate electrode 13 are sequentially formed on the amorphous silicon layer 11 while exposing both end portions of the amorphous silicon layer 11. A high-density impurity is ion-implanted into the exposed end portions of the amorphous silicon layer 11 to form source and drain regions 11S and 11D. A non-doped portion of the amorphous silicon layer 11 acts as a channel area 11C.

A photoresist pattern 15 is formed on the amorphous silicon layer 11 and covers the gate insulating layer 12 and the gate electrode 13. At this juncture, both end portions of the amorphous silicon layer 11 are not covered with the photoresist pattern 15. Thereafter, a metal layer 14 is deposited over the entire surface of the insulating substrate 10 using a sputtering technique. Preferably, the metal layer 14 is made of Ni, Pd, Ti, Ag, Au, Al, or Sb.

Referring now to FIG. 1B, the photoresist pattern 15 is removed using a lift-off technique, whereupon offset regions 17 are formed. Subsequently, the amorphous silicon layer 11 is crystallized by a furnace to form a poly silicon layer 11a. At this juncture, a portion of the amorphous silicon layer 11 that directly contacts the metal layer 14 is crystallized by a metal induced crystallization (MIC) technique, and the offset regions 17 and the channel area 11C are crystallized by the MILC technique.

In the conventional method of manufacturing the TFT using the MILC technique, traps are prevented since the boundaries between the MIC and MILC regions are located outside the channel area 11C, for example, within the source and drain regions 11S and 11D.

However, the conventional method of manufacturing the TFT using the MILC technique additionally requires a mask process to form the offset regions 17, thereby lowering productivity and increasing the production costs.

Also, since a crystallization is performed using the MILC technique after the gate insulating layer 12 and the gate electrode 13 are formed on the amorphous silicon layer 11, an interface characteristic between the gate insulating layer 12 and the channel area 11C deteriorates, and many trap sites are provided, whereby the electric field mobility is lowered.

In addition, an MILC front 11F, including a metal silicide, exists in the channel area 11C and serves as a defect of the TFT, thereby deteriorating reliability of the TFT. Here, the MILC front 11F is referred to as that portion where lateral growths meet each other when the amorphous silicon layer 11 is crystallized by the MILC technique. Such an MILC front 11F contains more metal components than other portions and becomes a defect of the semiconductor layer.

In order to locate the MILC front 11F outside the channel area 11C, a method is introduced such that the MIC region is non-symmetrically formed centering on the channel area 11C to perform a crystallization. That method is disclosed in IEEE Electron Device Letters, vol. 21, no. 7, July 2000, and is entitled "The Effects of Electrical Stress and Temperature on the Properties of Polycrystalline Silicon Thin Film Transistor Fabricated by Metal Induced Lateral Crystallization." However, this method has a problem in that a crystallization is non-symmetrically performed and thus a processing time for crystallization is increased.

SUMMARY OF THE INVENTION

To overcome the problems described above, preferred embodiments of the present invention provide a thin film transistor (TFT) having a high electric field mobility.

It is another object of the present invention to provide a TFT having a high productivity.

It is still another object of the present invention to provide a TFT having a high reliability.

In order to achieve the above objects, the preferred embodiments of the present invention provide a method of manufacturing a thin film transistor, comprising: a) forming an amorphous silicon layer and a blocking layer on an insulating substrate; b) forming a photoresist layer having first and second photoresist patterns on the blocking layer, the first and second photoresist patterns spaced apart from each other; c) etching the blocking layer using the first photoresist pattern as a mask to form first and second blocking patterns; d) reflowing the photoresist layer, so that the first and second photoresist patterns abut on each other so as to entirely cover the first and second blocking patterns; e) forming a metal layer over the entire surface of the insulating substrate; f) removing the photoresist layer to expose the blocking layer and an offset region between the blocking layer and the metal layer; g) crystallizing the amorphous silicon layer to form a poly silicon layer, wherein a portion of the amorphous silicon layer directly contacting the metal layer is crystallized through a metal induced crystallization (MIC), and the remaining portion of the amorphous silicon layer is crystallized through a metal induced lateral crystallization (MILC), so that an MILC front exists on a portion of the poly silicon layer between the first and second blocking patterns; h) etching the poly silicon layer using the first and second blocking patterns as a mask to form first and second semiconductor layers and to remove the MILC front; and i) removing the first and second blocking patterns.

The present invention further provides a method of manufacturing a thin film transistor, comprising: a) forming an amorphous silicon layer on an insulating substrate; b) forming a first photoresist layer on the amorphous silicon layer while exposing edge portions of the amorphous silicon layer; c) forming a metal layer over the entire surface of the insulating substrate; d) removing the first photoresist layer to expose a portion of the amorphous silicon layer under the first photoresist layer; e) crystallizing the amorphous silicon layer to form a poly silicon layer, wherein a portion of the amorphous silicon layer directly contacting the metal layer is crystallized through a metal induced crystallization (MIC), and the remaining portion of the amorphous silicon layer is crystallized through a metal induced lateral crystallization (MILC), so that an MILC front exists on an MILC portion of the poly silicon layer crystallized by the MILC; f) removing the metal layer; g) providing a second photoresist layer having first and second photoresist patterns on the MILC of the poly silicon layer to expose the MILC front, the first and second photoresist patterns spaced apart from each other; h) etching the poly silicon layer using the first and second photoresist patterns as a mask to form first and second semiconductor layers and to remove the MILC front; and i) removing the first and second photoresist patterns.

The metal layer is preferably made of Ni or Pd and preferably has a thickness of hundreds of Å. Preferably, a crystallization of the amorphous silicon layer is performed at a temperature of 400° C. to 600° C. The method further includes, after the step (i), surface-treating the first and second semiconductor layers. The surface treatment is preferably performed using a dry-etching technique or an HF etching solution of 0.1% to 20%. The blocking layer is patterned using a dry-etching technique or an HF etching solution of 0.1% to 20%. The method further includes, before the step (a), forming a buffer layer on the insulating substrate. The buffer layer, the amorphous silicon layer, and the blocking layer are sequentially formed through a plasma-enhanced chemical vapor deposition (PECVD) technique or the buffer layer is formed before the amorpohous silicon layer and the blocking layer are sequentially formed through the PECVD technique.

The method further includes, after the step (i): j) forming a gate insulating layer over the entire surface of the insulating substrate; k) forming a gate electrode on the gate insulating layer over the first and second semiconductor layers; l) forming first source and drain regions and second source and drain regions in the first and second semiconductor layers, respectively; m) forming an interlayer insulating layer over the entire surface of the insulating substrate; n) etching the interlayer insulating layer to form first source and drain contact holes and second source and drain contact holes, the first source and drain contact holes exposing the first and second source and drain regions, the second source and drain contact holes exposing the second and second source and drain regions, respectively; and o) forming source and drain electrodes, the source electrodes electrically connected to the first and second source regions through the first and second source contact holes, the drain electrodes electrically connected to the first and second drain regions through the first and second drain contact holes.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which:

FIGS. 2A to 2I are plan views illustrating a process of manufacturing a TFT according to an embodiment of the present invention;

DETAILED DESCRIPTION OF PREFFERED EMBODIMENTS

Reference will now be made in detail to preferred embodiments of the present invention, an example of which is illustrated in the accompanying drawings.

Figure 1A:
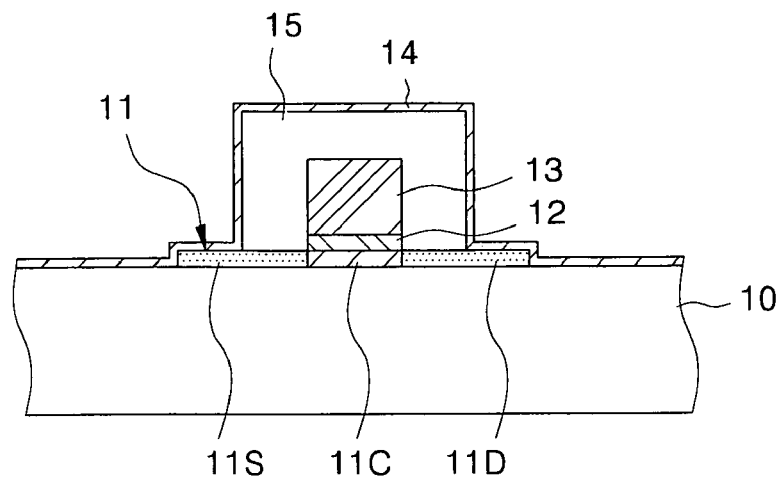
FIGS. 1A to 1B are cross-sectional views illustrating a process of manufacturing the thin film transistor (TFT) using an MILC technique according to conventional methods.
Figure 1B:
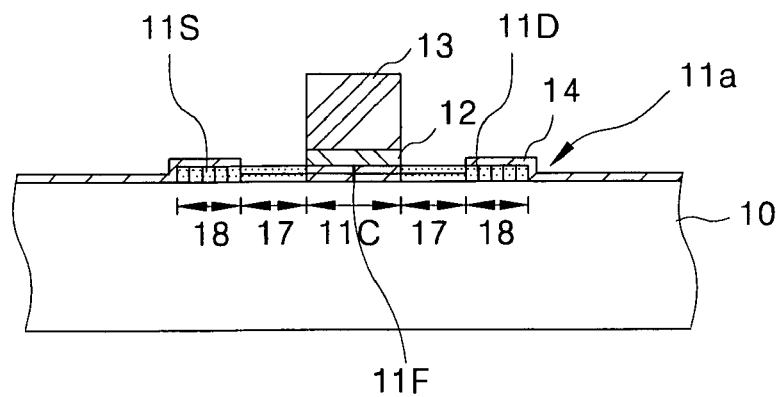
Figure 2A:
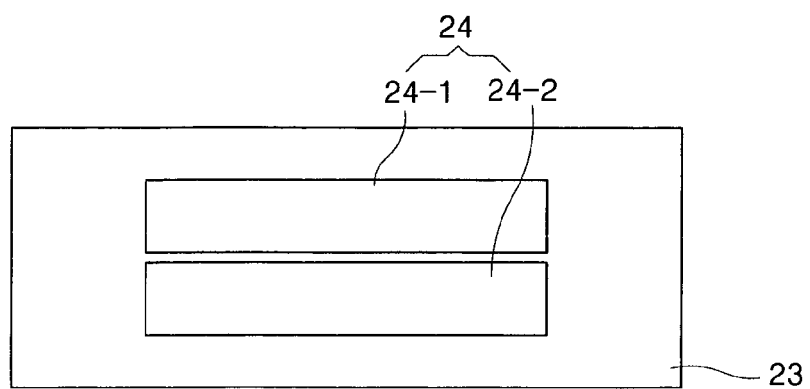
Figure 3A:
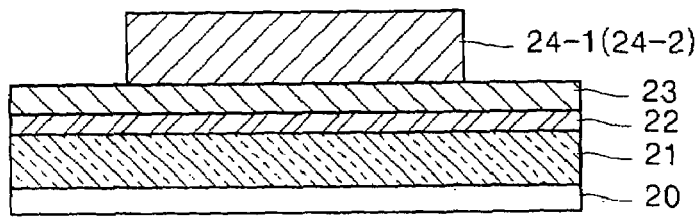
FIGS. 3A to 3I are cross-sectional views taken along line III-III of FIG. 2I, illustrating a process of manufacturing the TFT according to an embodiment of the present invention.

Referring to FIGS. 2A and 3A, a buffer layer 21, an amorphous silicon layer 22 and a blocking layer 23 are sequentially formed on an insulating substrate 20. The buffer layer 21 is preferably made of an oxide layer and serves to prevent an impurity from being diffused into a semiconductor layer which will be formed in a subsequent process. The blocking layer 23 is preferably made of an oxide layer.

There are two methods to form the buffer layer 21, the amorphous silicon layer 22, and the blocking layer 23. A first method is that after the buffer layer 21 is formed on the insulating substrate 20, the amorphous silicon layer 22 and the blocking layer 23 are deposited using a plasma-enhanced chemical vapor deposition (PECVD) technique. The second method is that the buffer 21, the amorphous silicon layer 22, and the blocking layer 23 can be sequentially deposited using the PECVD technique.

A photoresist pattern 24 is formed on the blocking layer 23. The photoresist pattern 24 has the same pattern as a mask to form a dual-channel semiconductor layer which will be formed in a subsequent process. In other words, the photoresist pattern 24 includes first and second photoresist patterns 24-1 and 24-2, which are spaced apart from each other as shown in FIG. 2A.

Figure 2B:
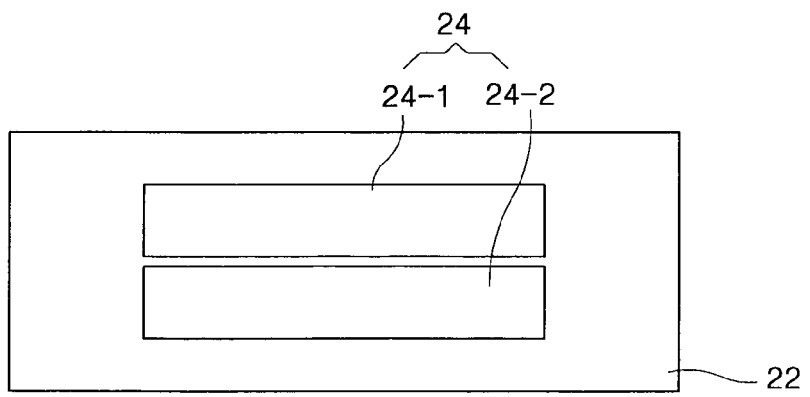
Figure 3B:
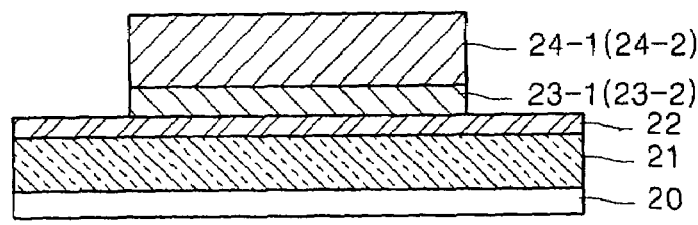

Referring now to FIGS. 2B and 3B, using the photoresist pattern 24 as a mask, the blocking layer 23 is patterned using a dry-etching technique or an HF etching solution while exposing both end portions of the amorphous silicon layer 22, so that the blocking layer 23 includes first and second blocking patterns 23-1 and 23-2. The first and second blocking patterns 23-1 and 23-2 are spaced apart from each other.

In FIGS. 2A to 2I and 3A to 3I, reference numerals in parentheses denote parts which are not shown due to a viewing angle.

Figure 2C:
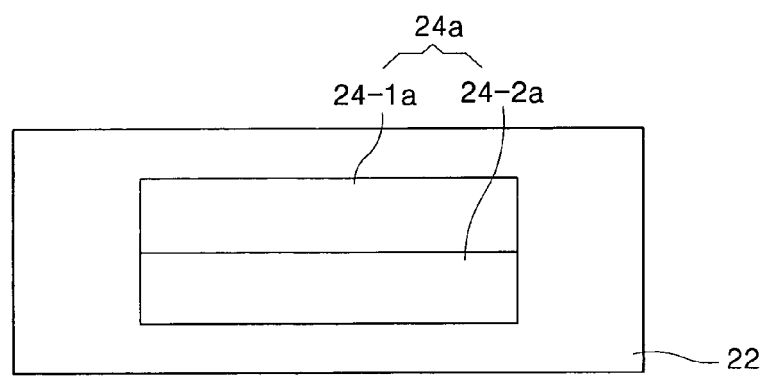
Figure 3C:
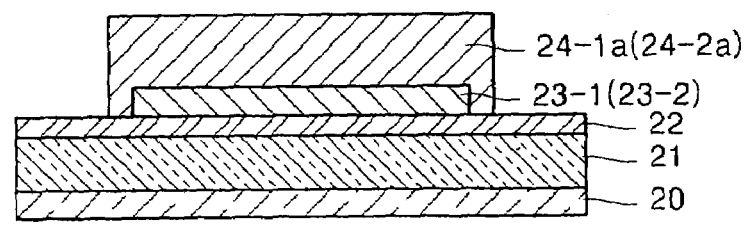

Referring now to FIGS. 2C and 3C, the photoresist pattern 24 is reflowed to entirely cover the patterned blocking layer 23. A first reflowed photoresist pattern 24-1a and a second reflowed photoresist pattern 24-2a of the reflowed photoresist pattern 24a abut on each other, so that a portion of the amorphous silicon layer 22 between the first blocking pattern 23-1 and the second blocking pattern 23-2 is covered.

Figure 2D:
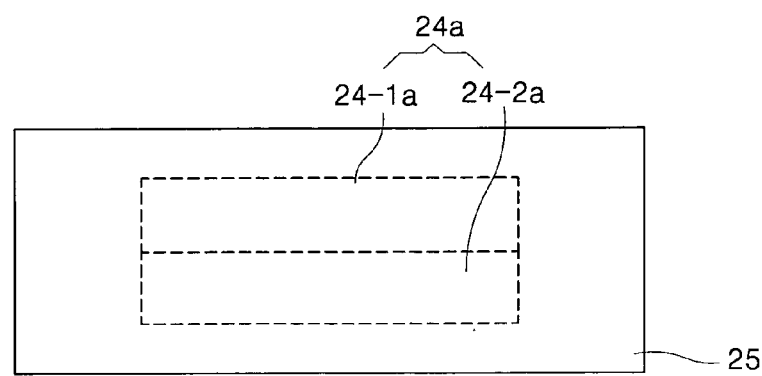
Figure 3D:
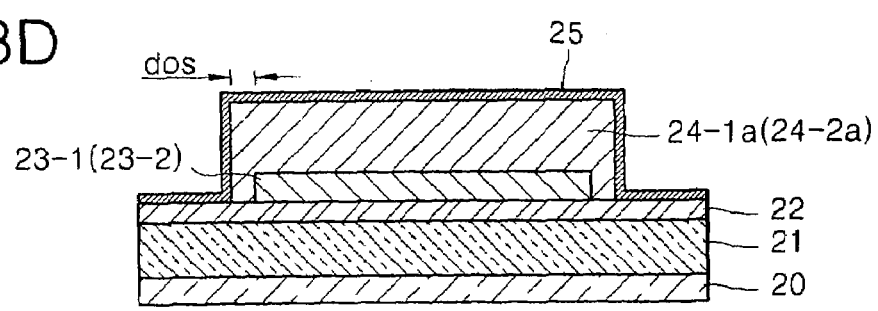

Referring now to FIGS. 2D and 3D, a first metal layer 25 is formed over the entire surface of the substrate 20. The first metal layer 25 directly contacts the exposed end portions of the amorphous silicon layer 22. The first metal layer 25 preferably has a thickness of hundreds of Å and is preferably made of a material which can react with silicon (Si) to form a silicide such as Ni or Pd.

Figure 2E:
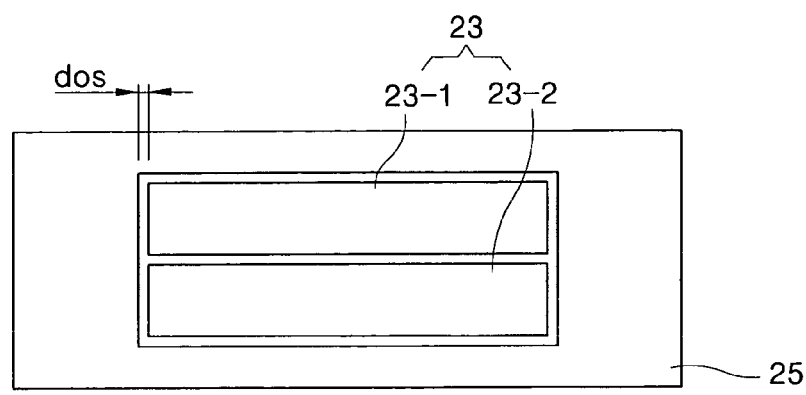
Figure 3E:
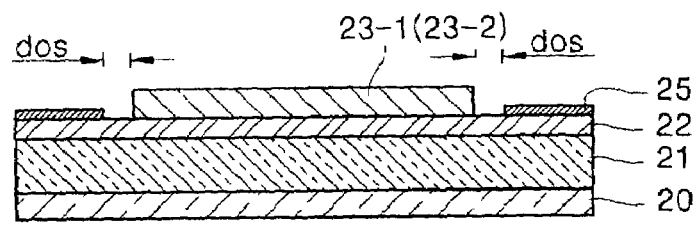

Referring now to FIGS. 2E and 3E, the first and second reflowed photoresist patterns 24-1a and 24-2a are removed to expose the blocking layer 23 and to expose an offset region "dos" of the amorphous silicon layer 22. Therefore, the first metal layer 25 remains only on both end portions of the amorphous silicon layer 22.

Figure 2F:
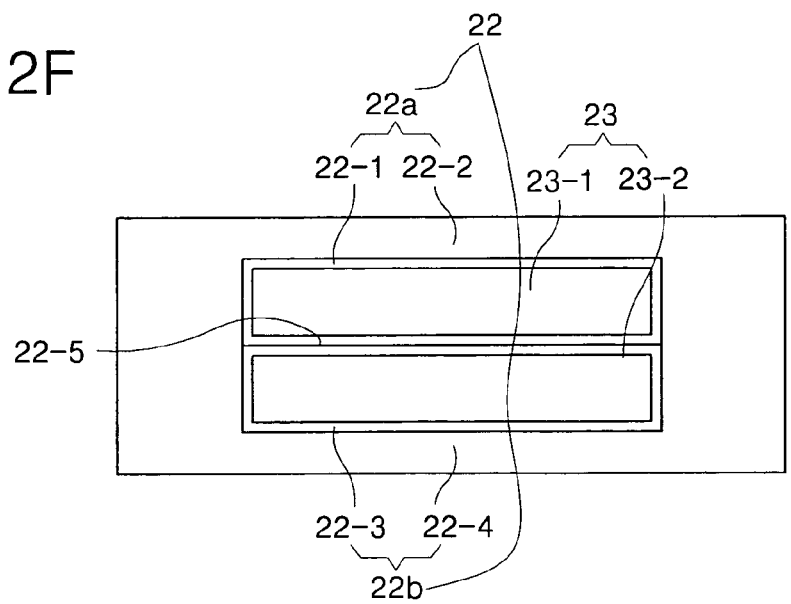
Figure 3F:
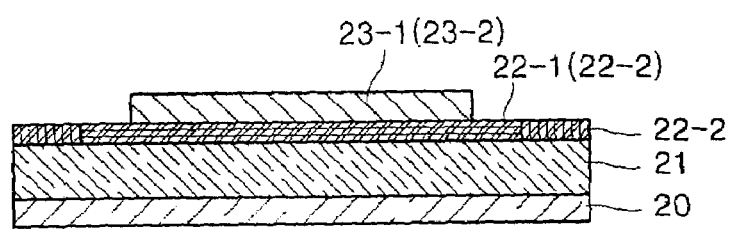

Referring now to FIGS. 2F and 3F, the amorphous silicon layer 22 is crystallized at a temperature of preferably 400° C. to 600° C. to form a poly silicon layer 22. At this moment, both end portions of the amorphous silicon layer 22 that directly contact the metal layer 25 are crystallized by the MIC, and a non-contact portion of the amorphous silicon layer 22 that does not contact the metal layer 25 is crystallized by the MILC. The poly silicon layer 22 includes poly silicon layers 22a and 22b. The poly silicon layer 22a includes first and second poly silicon layers 22-1 and 22-2, and the poly silicon layer 22b includes first and second poly silicon layers 22-3 and 22-4. The first poly silicon layers 22-1 and 22-3 are formed by the MILC, and the second poly silicon layers 22-2 and 22-4 are formed by the MIC. Also, an MILC front 22-5 exists between the poly silicon layers 22a and 22b. The first metal layer 25 remaining on the poly silicon layers 22a and 22b is removed to expose the second poly silicon layers 22-2 and 22-4.

Figure 2G:
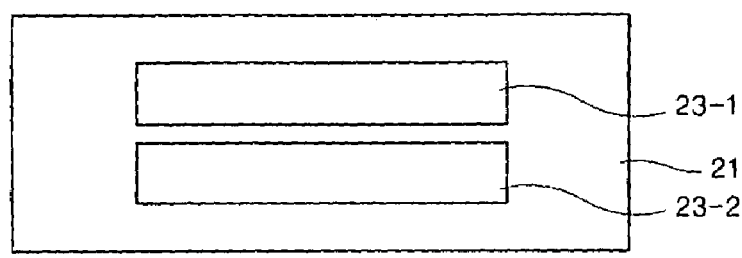
Figure 2H:
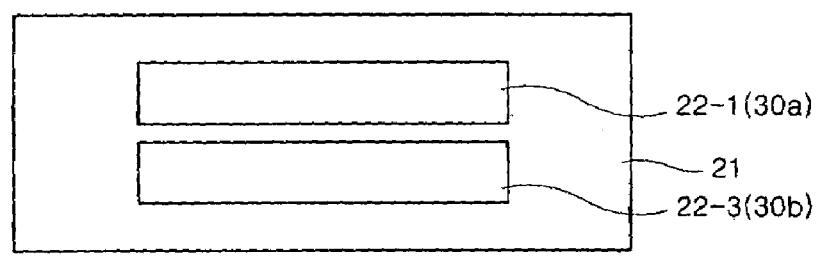
Figure 21:
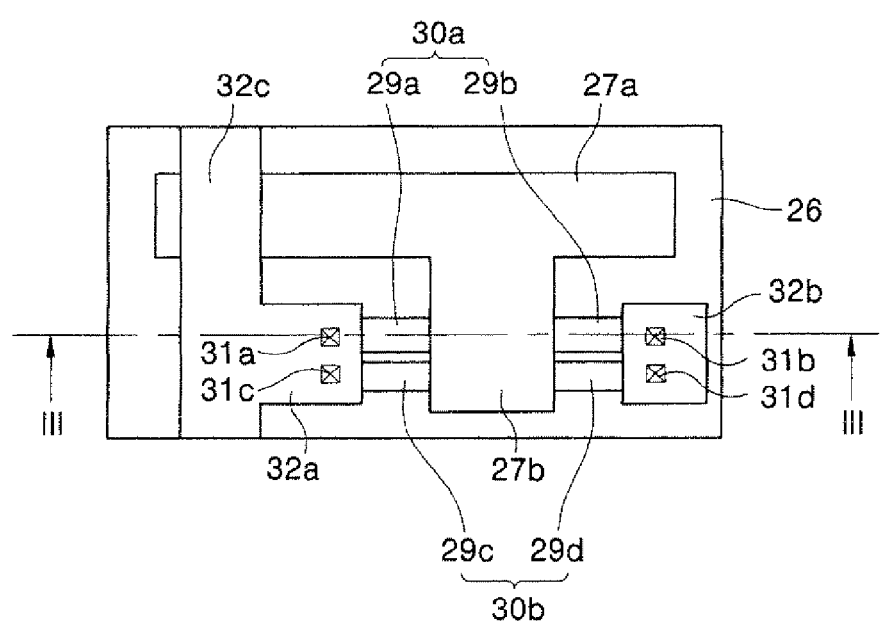
Figure 3G:
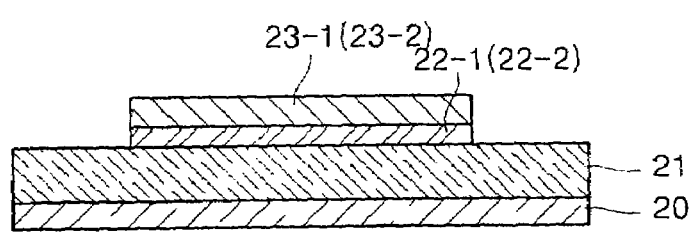
Figure 3H:
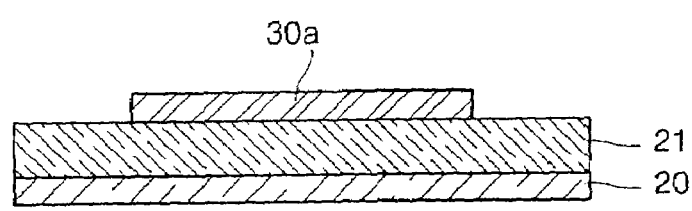

Referring now to FIGS. 2G and 3G, using the first blocking pattern 23-1 and the second blocking pattern 23-2 as a mask, the poly silicon layers 22a and 22b are etched to form first and second semiconductor layers 30a and 30b (see FIGS. 2H and 3H). Therefore, the first and second semiconductor layers 30a and 30b include only the MILC regions 22-2 and 22-4, respectively. The MILC front 22-5 is removed while etching the poly silicon layers 22a and 22b. Thereafter, the blocking layer 23 is removed.

Referring now to FIGS. 2H and 3H, a surface treatment process is performed in order to improve a surface characteristic of the semiconductor layers 30a and 30b. The surface treatment process is to remove a natural oxide layer (not shown) or impurities on the semiconductor layers 30a and 30b and is performed using a dry-etching technique or an HF etching solution of 0.1% to 20%.

At this point, in case the blocking layer 23 is made of an oxide layer, the surface treatment process can be performed at the same time as the process of removing the blocking layer 23.

Figure 3I:
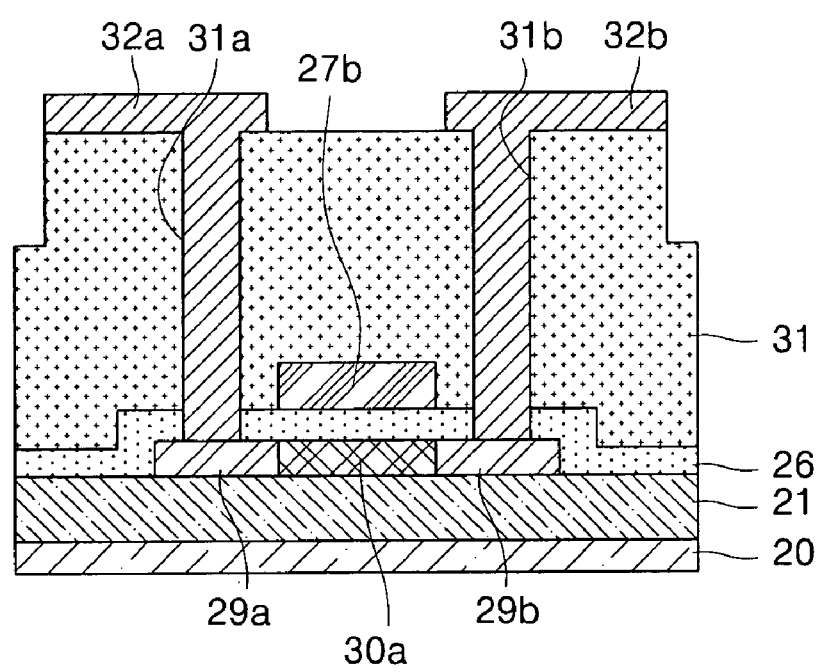

Referring now to FIGS. 2I and 3I, the TFT having a dual channel is completed using the first and second semiconductor layers 30a and 30b. In greater detail, a gate insulating layer 26 is formed over the entire surface of the substrate 20. A second metal layer is deposited over the entire surface of the substrate 20 and patterned to form a gate line 27a and a gate electrode 27b. The gate electrode 27b extends from the gate line 27a.

Subsequently, using the gate electrode 27b as a mask, a p- or an n-type high-density impurity is ion-implanted into the first and second semiconductor layers 30a and 30b to form first source and drain regions 29a and 29b and second source and drain regions 29c and 29d, respectively. The non-doped portions of the first and second semiconductor layers 30a and 30b serve as a channel area.

At this point, an offset region or a lightly doped drain (LDD) region can be formed between the source and drain regions and the channel area. The method of forming the offset region or the LDD region is well known.

Next, an interlayer insulating layer 31 is formed over the entire surface of the substrate 20. The interlayer insulating layer 31 includes contact holes 31a to 31d. The contact holes 31a and 31b are formed at a location corresponding to a portion of the first source region 29a and to a portion of the first drain region 29b, respectively. The contact holes 31c and 31d are formed at a location corresponding to a portion of the second source region 29c and to a portion of the second drain region 29d, respectively.

Thereafter, a third metal layer is deposited on the interlayer insulating layer 31 and patterned to form source and drain electrodes 32a and 32b and a data line 32c. The source electrode 32a extends from the data line 32c and is electrically connected to the first and second source regions 29a and 29c, respectively, through the contact holes 31a and 31c. The drain electrode 32b is electrically connected to the first and second drain regions 29b and 29d, respectively, through the contact holes 31b and 31d. Consequently, the TFT according to the present invention is completed.

As described herein, the TFT according to an embodiment of the present invention has numerous advantages. Since a mask process to crystallize the amorphous silicon layer is not required, the manufacturing process is simplified, thus leading to a high manufacturing yield. Also, since the MILC front is removed, the formation of defects can be prevented, leading to high reliability.

Figure 4A:
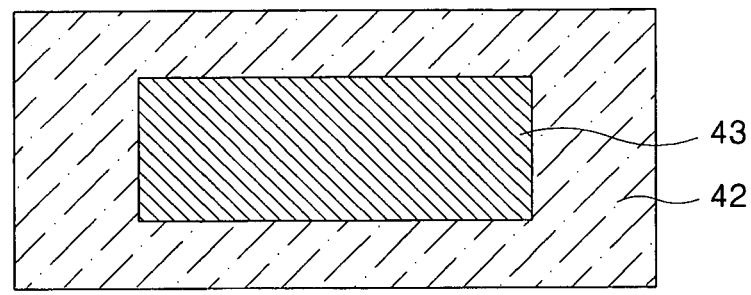
FIGS. 4A to 4G are plan views illustrating a TFT according to another embodiment of the present invention.
Figure 5A:
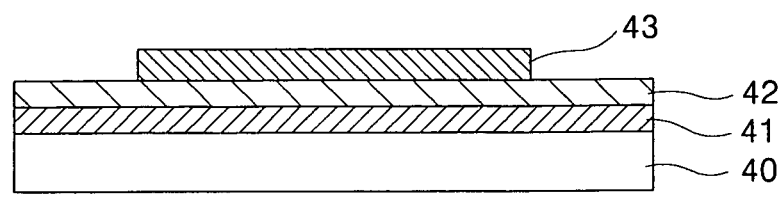
FIGS. 5A to 5G are cross-sectional views taken along line V-V of FIG. 4G.

Referring now to FIGS. 4A and 5A, a buffer layer 41 and an amorphous silicon layer 42 are sequentially formed on an insulating substrate 40. The buffer layer 41 is preferably made of an oxide layer and serves to prevent an impurity from being diffused into a semiconductor layer which will be formed in subsequent process. At this point, the buffer layer 41 and the amorphous silicon layer 42 can be formed using the PECVD technique. Thereafter, a photoresist pattern 43 is formed on the amorphous silicon layer 42 while exposing both end portions of the amorphous silicon layer 42.

Figure 4B:
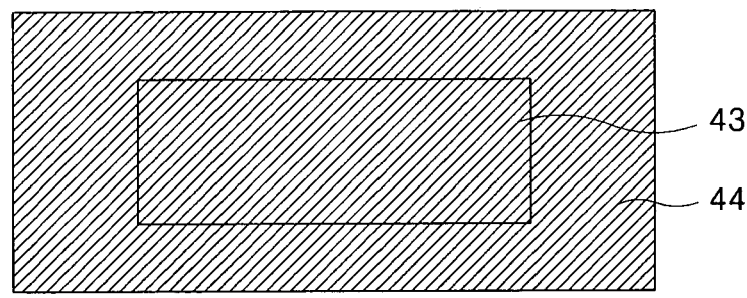
Figure 5B:
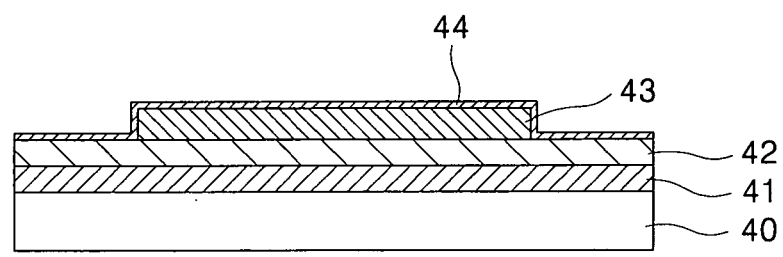

Referring now to FIGS. 4B and 5B, a first metal layer 44 is formed over the whole surface of the substrate 40 and covers the photoresist pattern 43. The first metal layer 44 is preferably made of a material which reacts with silicon to form a silicide such as Pd or Ni. The first metal layer 44 preferably has a thickness of 1 Å to 5000 Å and preferably tens to hundreds of Å and directly contacts the exposed end portions of the amorphous silicon layer 42.

Figure 4C:
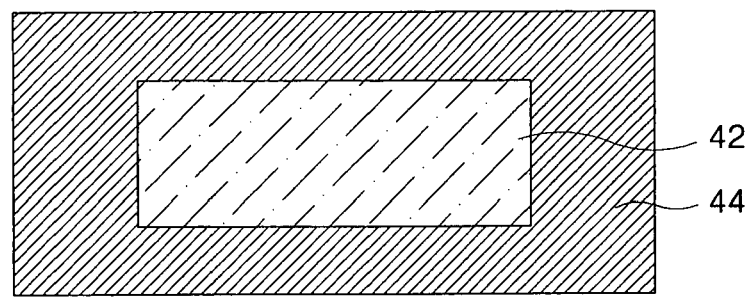
Figure 5C:
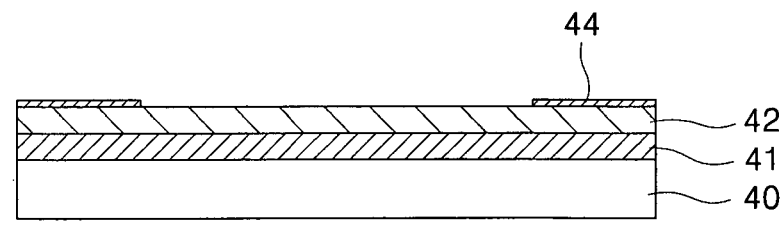

Referring now to FIGS. 4C and 5C, the photoresist pattern 43 is removed to expose a central portion of the amorphous silicon layer 42. The first metal layer 44 remains only on both end portions of the amorphous silicon layer 42.

Figure 4D:
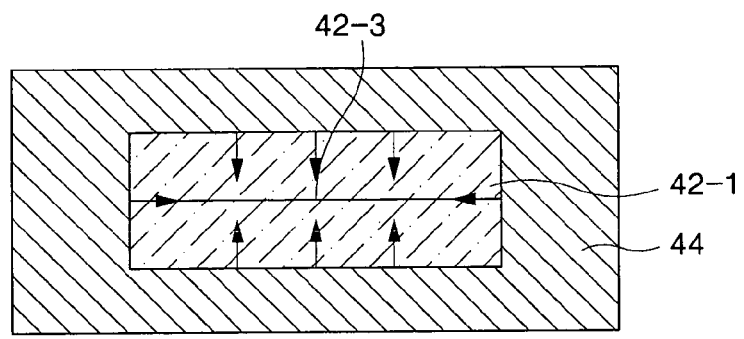
Figure 5D:
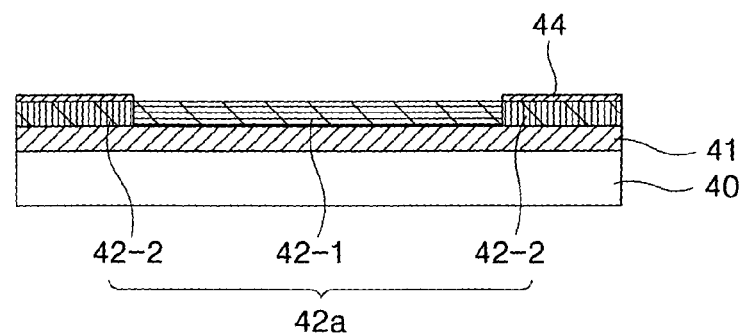

Referring now to FIGS. 4D and 5D, the amorphous silicon layer 42 is crystallized at a temperature of preferably 400° C. to 600° C. to form a poly silicon layer 42a. The exposed portion of the amorphous silicon layer 42 is crystallized by the MILC, and both end portions of the amorphous silicon layer 42 which directly contact the first metal layer 44 are crystallized by the MIC.

At this juncture, since a contact region between the amorphous silicon layer 42 and the first metal layer 44 is relatively large, a crystallization speed will increase. An MILC front 42-3 exists on a central portion of the poly silicon layer 42a (i.e., MILC region 42-1).

Figure 4E:
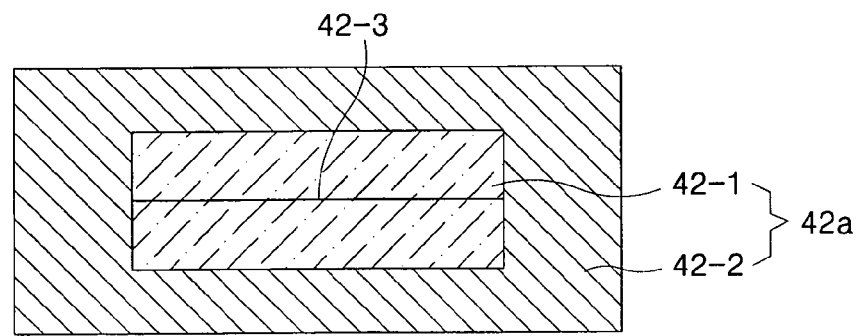
Figure 5E:
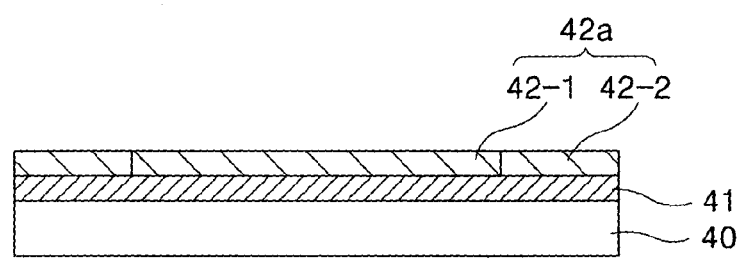

Referring now to FIGS. 4E and 5E, the first metal layer 44 remaining on MIC regions 42-2 of the poly silicon layer 42a is removed.

Figure 4F:
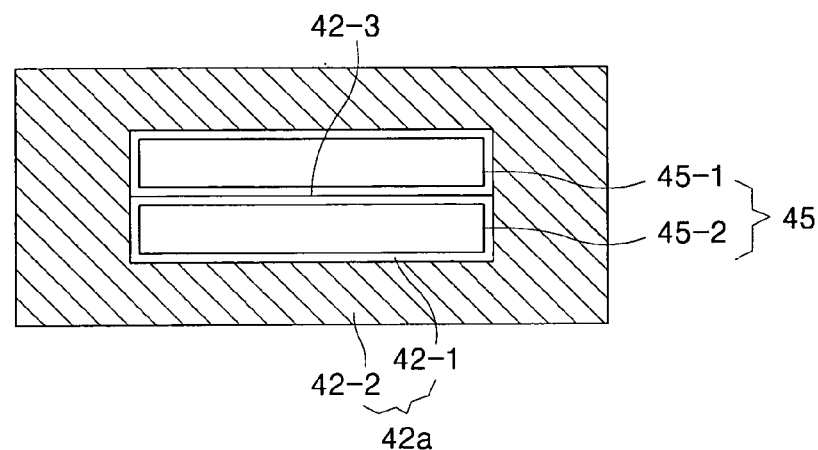
Figure 5F:
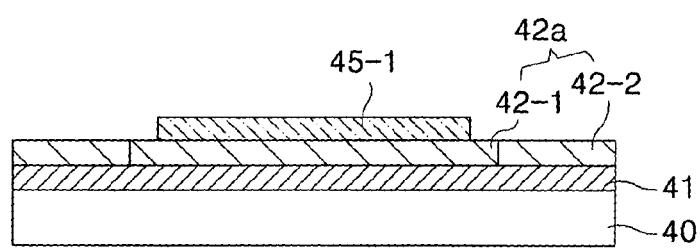

Referring now to FIGS. 4F and 5F, a photoresist pattern 45 is formed on the poly silicon layer 42a. The photo resist pattern 45 includes first and second photoresist patterns 45-1 and 45-2. The first and second photoresist patterns 45-1 and 45-2 are formed on the corresponding MILC regions 42-1, respectively, and are spaced apart from each other, so that the MILC front 42-3 is exposed.

Figure 4G:
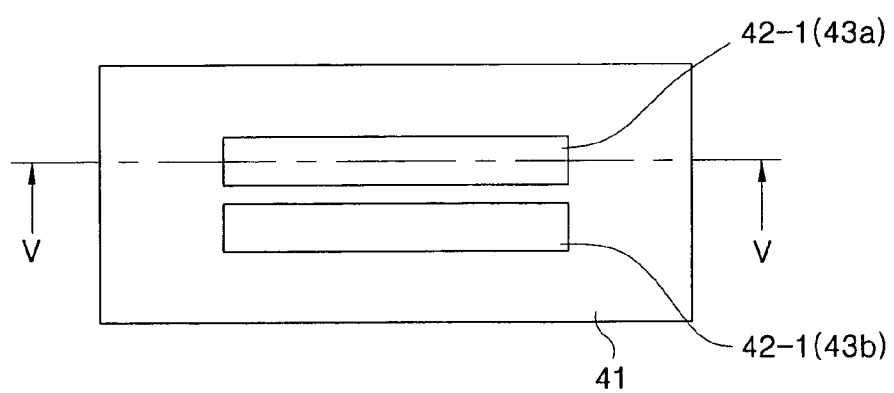
Figure 5G:
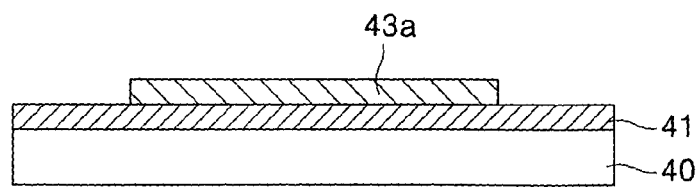

Referring now to FIGS. 4G and 5G, using the photoresist pattern 45 as a mask, the poly silicon layer 42 is etched to form first and second semiconductor layers 43a and 43b. At the same time, the MILC front 42-3 is removed. Therefore, the first and second semiconductor layers 43a and 43b include only the MILC regions 42-1. Thereafter, the photoresist pattern 45 is removed.

Subsequently, a surface treatment process is performed in order to improve a surface characteristic of the semiconductor layers 43a and 43b. The surface treatment process is to remove a natural oxide layer (not shown) or impurities on the semiconductor layers 43a and 43b and is performed using a dry-etching technique or an HF etching solution of 0.1% to 20%.

Thereafter, even though not shown in the drawings, the process of FIGS. 2I and 3I is performed to complete the TFT according to another embodiment of the present invention.

As described herein, the TFT according to an embodiment of the present invention has numerous advantages. First, since crystallization simultaneously processes from all edge portions of the amorphous silicon layer, the processing time is reduced. Second, since the MILC front is removed, the formation of defects is prevented, thereby improving reliability. Third, traps are prevented since the boundaries between the MIC and MILC regions are located outside the channel area, for example, within the source and drain regions, thereby improving electric field mobility. Fourth, since the amorphous silicon layer is crystallized without an additional mask process, the manufacturing process is simplified, leading to a high manufacturing yield.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for manufacturing a thin film transistor, comprising:

forming an amorphous silicon layer and a blocking layer on an insulating substrate;

forming a photoresist layer having first and second photoresist patterns on the blocking layer, the first and second photoresist patterns spaced apart from each other;

etching the blocking layer using the first photoresist pattern as a mask to form first and second blocking patterns;

reflowing the photoresist layer, so that the first and second photoresist patterns abut each other to entirely cover the first and second blocking patterns;

forming a metal layer over an entire first surface of the insulating substrate;

removing the photoresist layer to expose the blocking layer and an offset region between the blocking layer and the metal layer;

crystallizing the amorphous silicon layer to form a poly silicon layer with a metal induced lateral crystallization front etching the poly silicon layer using the first and second blocking patterns as a mask to form first and second semiconductor layers and to remove the metal induced lateral crystallization front;

removing the first and second blocking patterns; and forming a metal layer for a source electrode and a drain electrode.

2. A method for manufacturing a thin film transistor, comprising:

forming an amorphous silicon layer on an insulating substrate;

forming a first photoresist layer on the amorphous silicon layer while exposing edge portions of the amorphous silicon layer;

forming a metal layer over an entire first surface of the insulating substrate;

removing the first photoresist layer to expose a portion of the amorphous silicon layer under the first photoresist layer;

crystallizing the amorphous silicon layer to form a poly silicon layer with a metal induced lateral crystallization front;

forming a second photoresist layer having first and second photoresist patterns on the metal induced lateral crystallization front of the poly silicon layer to expose the metal induced lateral crystallization front, the first and second photoresist patters spaced apart from each other;

etching the poly silicon layer using the first and second photoresist patters as a mask to form first and second semiconductor layers and to remove the metal induced lateral crystallization front;

removing the first and second photoresist patterns; and forming a metal layer for a source electrode and a drain electrode.

* * * * *